US007822162B2

(12) United States Patent
Chang et al.

(10) Patent No.: US 7,822,162 B2
(45) Date of Patent: Oct. 26, 2010

(54) CURRENT MODE DIFFERENTIAL SIGNAL TRANSMITTING CIRCUIT SHARING A CLOCK OUTPUTTING UNIT

(75) Inventors: Hsien-Chun Chang, Chi-Lung (TW); Chao-Hsin Lu, Tao-Yuan Hsien (TW); Ming-Yen Hsu, Taipei Hsien (TW)

(73) Assignee: Realtek Semiconductor Corp, Hsinchu (TW)

( * ) Notice: Subject to any disclaimer, the term of this patent is extended or adjusted under 35 U.S.C. 154(b) by 688 days.

(21) Appl. No.: 11/627,379

(22) Filed: Jan. 26, 2007

(65) Prior Publication Data

US 2007/0171991 A1    Jul. 26, 2007

(30) Foreign Application Priority Data

Jan. 26, 2006  (TW) .............................. 95103156 A

(51) Int. Cl.
*H04L 7/00* (2006.01)
*H04B 3/00* (2006.01)
*H03F 3/45* (2006.01)

(52) U.S. Cl. .......................... 375/356; 375/257; 330/69

(58) Field of Classification Search ......... 375/219–222, 375/257, 295, 354, 356; 327/335; 330/3, 330/295, 61 R, 61 A, 69, 124 R, 126
See application file for complete search history.

(56) References Cited

U.S. PATENT DOCUMENTS

| 5,424,662 | A | 6/1995 | Bonaccio |
| 6,557,062 | B1 | 4/2003 | Shaler |
| 6,903,706 | B1 * | 6/2005 | Trottier et al. ............... 345/1.1 |
| 2003/0149987 | A1 * | 8/2003 | Pasqualino et al. ............. 725/80 |
| 2003/0152160 | A1 * | 8/2003 | Bauch et al. ................ 375/295 |
| 2006/0002483 | A1 | 1/2006 | Kim |
| 2007/0136621 | A1 * | 6/2007 | Alon et al. .................. 713/503 |

* cited by examiner

*Primary Examiner*—Young T. Tse
(74) *Attorney, Agent, or Firm*—Thomas, Kayden, Horstemeyer & Risley

(57) ABSTRACT

A current-mode differential signal transmitting circuit is disclosed, including a transmitter having a first transmitting module and a second transmitting module. The first transmitting module includes a plurality of first outputting units to output first data and a clock outputting signal. The second transmitting module includes a plurality of second outputting units for outputting second data, and the first and second transmitting modules share this clock outputting unit.

23 Claims, 4 Drawing Sheets

CURRENT MODE DIFFERENTIAL SIGNAL TRANSMITTING CIRCUIT SHARING A CLOCK OUTPUTTING UNIT

BACKGROUND OF THE INVENTION

1. Field of the Invention

The present invention relates to a current-mode differential signal transmitting circuit, and more particularly, to a current-mode differential signal transmitting circuit sharing a clock output unit.

2. Description of the Prior Art

Current-mode differential signal transmitting circuits are utilized for comparing the current or voltage of the input signals. For example, low voltage differential signaling (LVDS) transmitting circuits and reduced swing differential signal (RSDS) transmitting circuits are well-known by those of average skill in the art and are types of current-mode differential signal transmitting circuits.

FIG. 1 illustrates a prior art current mode differential signal transmitting circuit. As shown in FIG. 1, the current-mode differential signal transmitting circuit 100 includes a transmitter 102 and a receiver 104, wherein the transmitter 102 includes a first transmitting module 103 and a second transmitting module 105 and the receiver 104 includes a first receiving module 107 and a second receiving module 109. As shown in FIG. 1, the current-mode differential signal transmitting circuit transmits data by using a conventional dual-port connection, wherein the first transmitting module 103 corresponds to the first receiving module 107 and the second transmitting module 105 corresponds to the second receiving module 109. The first transmitting module 103 and the second transmitting module 105 include the same circuit structures, and the first receiving module 107 and the second receiving module 109 includes the same circuit structures.

The first transmitting module 103 includes a plurality of first outputting units 103a through 103d and a first clock outputting unit 110, and the second transmitting module 105 also includes a plurality of second outputting units 105a through 105d and a second clock outputting unit 112. The first outputting units 103a through 103d are used for outputting data to the receiver 104, and the clock outputting units 110 and 112 are used for outputting data transmitting clock signals $C_1$ and $C_2$ corresponding to data. However, each transmitting module of the above mentioned transmitting circuit includes a clock outputting unit, and the number of the clock outputting units increase as the number of the transmitting modules increase, thus the demand for pins also increases, and which does not meet the requirement of the desired device with minimized components. A novel transmitting circuit is needed to solve the above-mentioned problems.

SUMMARY OF THE INVENTION

One objective of the present invention is to provide a current mode differential signal transmitting circuit, which shares a clock outputting unit to save pins.

According to the claimed invention, a current-mode differential signal transmitting circuit including a transmitter with a first transmitting module and a second transmitting module is disclosed. The first transmitting module includes a plurality of first outputting units to output first data and a clock outputting unit, and the second transmitting module includes a plurality of second outputting units for outputting second data, wherein the first and second transmitting modules share the clock outputting unit.

Also, the transmitting circuit can further include a receiver coupled to the transmitter, wherein the receiver includes a first receiving module and a second receiving module. The first receiving module includes a plurality of first receiving units coupled to the first outputting units respectively to receive the first data and a first clock receiving unit coupled to the clock outputting unit to receive a first data receiving clock signal corresponding to the data transmitting clock signal. The second receiving module includes a plurality of second receiving units coupled to the second outputting units respectively to receive the second data and a second clock receiving unit coupled to the clock outputting unit to receive a second data receiving clock signal corresponding to the data transmitting clock signal.

Therefore, the present invention decreases the IC pins, the cost, and the area to meet the requirements of designing IC.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
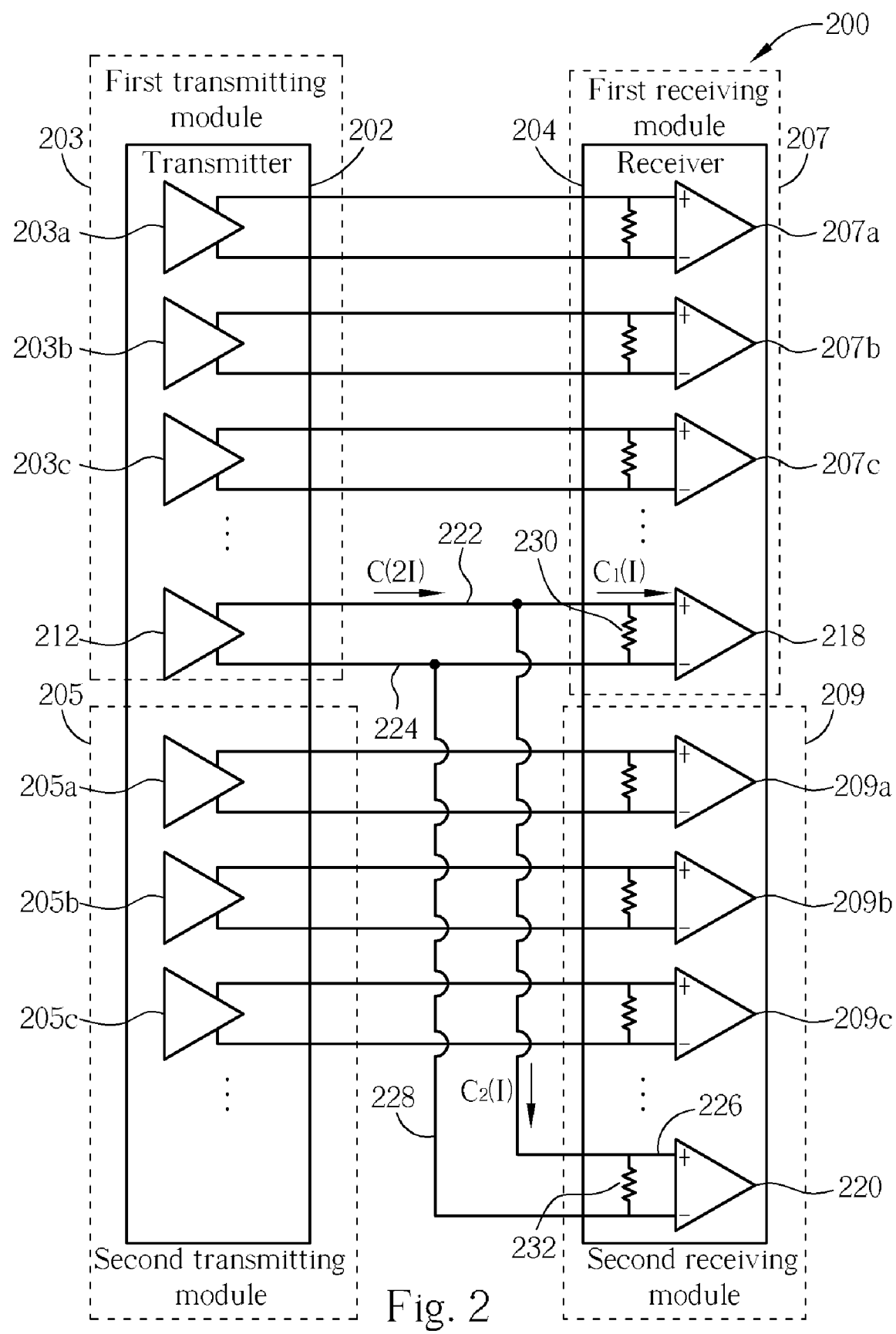
FIG. 2 illustrates a current mode differential signal transmitting circuit according to the first embodiment of the present invention.

FIG. 2 illustrates a current mode differential signal transmitting circuit 200 according to the first embodiment of the present invention. As shown in FIG. 2, the current-mode differential signal transmitting circuit 200 includes a transmitter 202 and a receiver 204, wherein the transmitter includes a first transmitting module 203 and a second transmitting module 205, and the receiver 204 includes a first receiving module 207 and a second receiving module 209. The first transmitting module 203 includes a plurality of first outputting units (for brevity, FIG. 2 illustrates only three first outputting units 203a through 203c) and a clock outputting unit 212, and the second transmitting module 205 includes a plurality of second outputting units (for brevity, FIG. 2 illustrates only three second outputting units 205a through 205c). As described above, the first outputting units 203a through 203c and the second outputting units 205a through 205c are used for outputting first data and second data respectively, and the clock outputting unit 212 is used for outputting the data transmitting clock signal C corresponding to first and second data. It should be noted that the second transmitting module_205 includes no clock outputting units, and the second data outputted from the first outputting units of which corresponds to the data transmitting clock signal C outputted from the clock outputting unit 212.

Furthermore, the first receiving module_207 includes a plurality of first receiving units (for brevity, FIG. 2 illustrates only three first receiving units 207a through 207c) and a first clock receiving unit 208. The first receiving units 207a through 207c are coupled to the first outputting units 203a through 203c respectively to receive first data, and the first clock receiving unit_218 is coupled to the clock outputting unit 212 to receive the first receiving clock signal $C_1$ corresponding to the data transmitting clock signal C. Additionally, the second receiving module 209 also includes a plurality of second receiving units (for brevity, FIG. 2 illustrates only three second receiving units 209a through 209c) and a second clock receiving unit 220. The second receiving units 209a through 209c are coupled to the second outputting units 205a~205c respectively to receive second data, and the second clock receiving unit 220 is coupled to the clock outputting unit 212 to receive the second receiving clock signal $C.sub.2$ corresponding to the data transmitting clock signal C.

In this embodiment, the clock outputting unit 212 is an amplifier with a positive terminal and a negative terminal, and the clock receiving units 218, 220 are receivers with a positive terminal and a negative terminal. Also, the clock receiving units 218, 220 further include resistors 230 and 232. Thus, to meet the desired current while the first transmitting module 203 and the second transmitting module 205 sharing the clock outputting unit 212, the connecting lines between the transmitter 202 and the receiver 204 are specifically configured. As shown in FIG. 2, the current mode differential signal transmitting circuit 200 according to the first embodiment of the present invention further includes a first connecting line 222, a second connecting line 224, a third connecting line 226 and a fourth connecting line 228, wherein the first connecting line 222 is coupled to a positive terminal of the clock outputting unit 212 and a positive terminal of the first clock receiving unit 218, the second connecting line 224 is coupled to a negative terminal of the clock outputting unit 212 and a negative terminal of the first clock receiving unit 218, the third connecting line 226 is coupled to a positive terminal of the clock outputting unit 212 and a positive terminal of the second clock receiving unit 220, and the fourth connecting line 228 is coupled to a negative terminal of the clock outputting unit 212 and a negative terminal of the second clock receiving unit 220.

Figure 1:
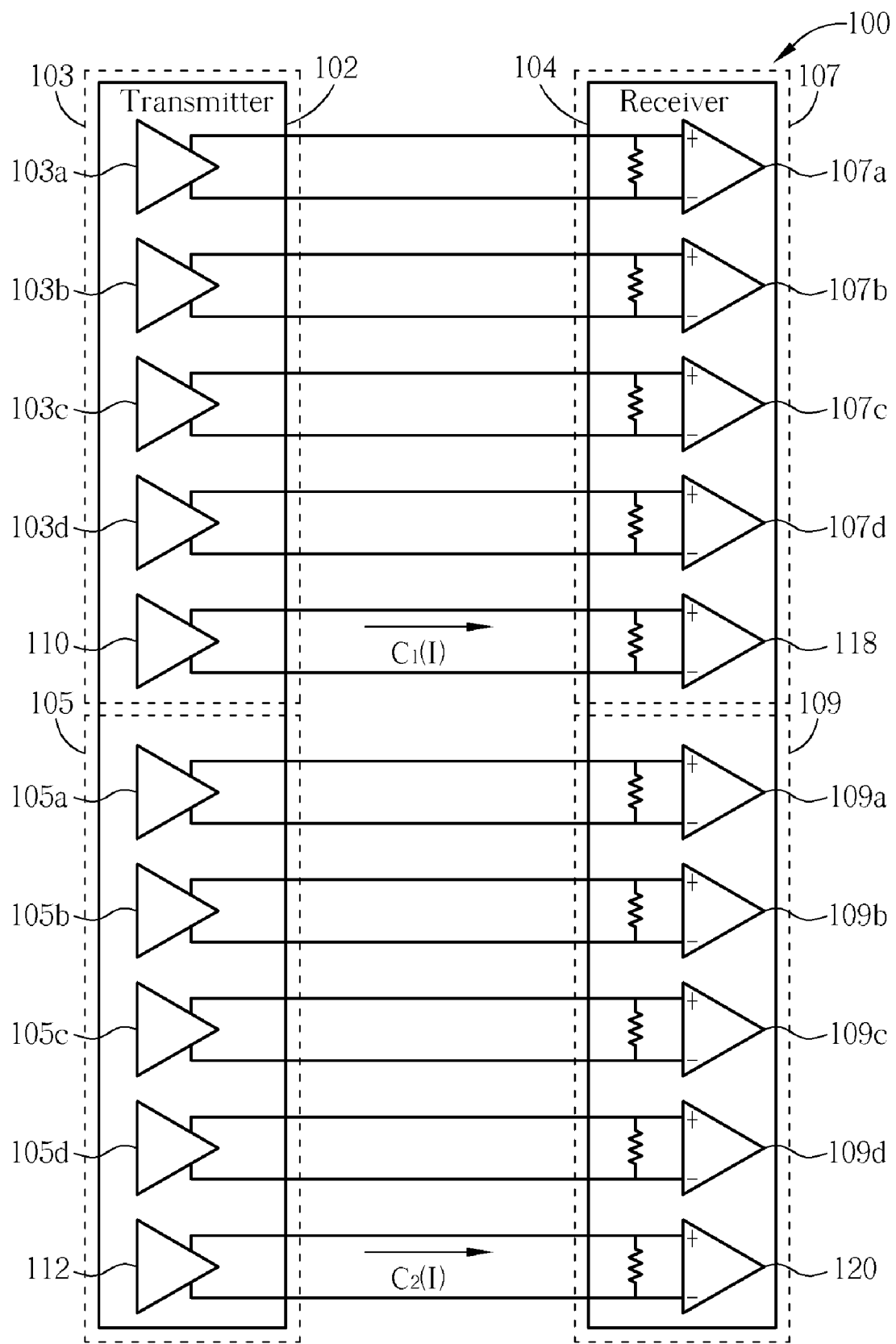
FIG. 1 illustrates a prior art current mode differential signal transmitting circuit.

Thus, the current outputted from the clock outputting unit 212 can be adjusted to meet the requirement of the current to the receiver 204. Regarding the conventional current-mode differential signal transmitting circuit 100 shown in FIG. 1, for example, if the value of the current outputted from the first clock outputting unit 110 and the second clock outputting unit 112 to the receiver 104 is I, the value of the current outputted from the clock outputting unit 212 is adjusted to 2I, and the current to the first clock receiving unit 218 and the second clock receiving unit 220 is also I by passing through the first connecting line 222, the second connecting line 224, the third connecting line 226, the fourth connecting line 228 and the resistors 230, 232. Therefore, the transmitter 202 can replace the transmitter 102 shown in FIG. 1 to be applied in the receiver 104 shown in FIG. 1. Accordingly, by adjusting the value of resistors 230 and 232, the value of the current to the first clock receiving unit 218 and the second clock receiving unit 220 can be adjusted to any required value for any design.

Figure 3:
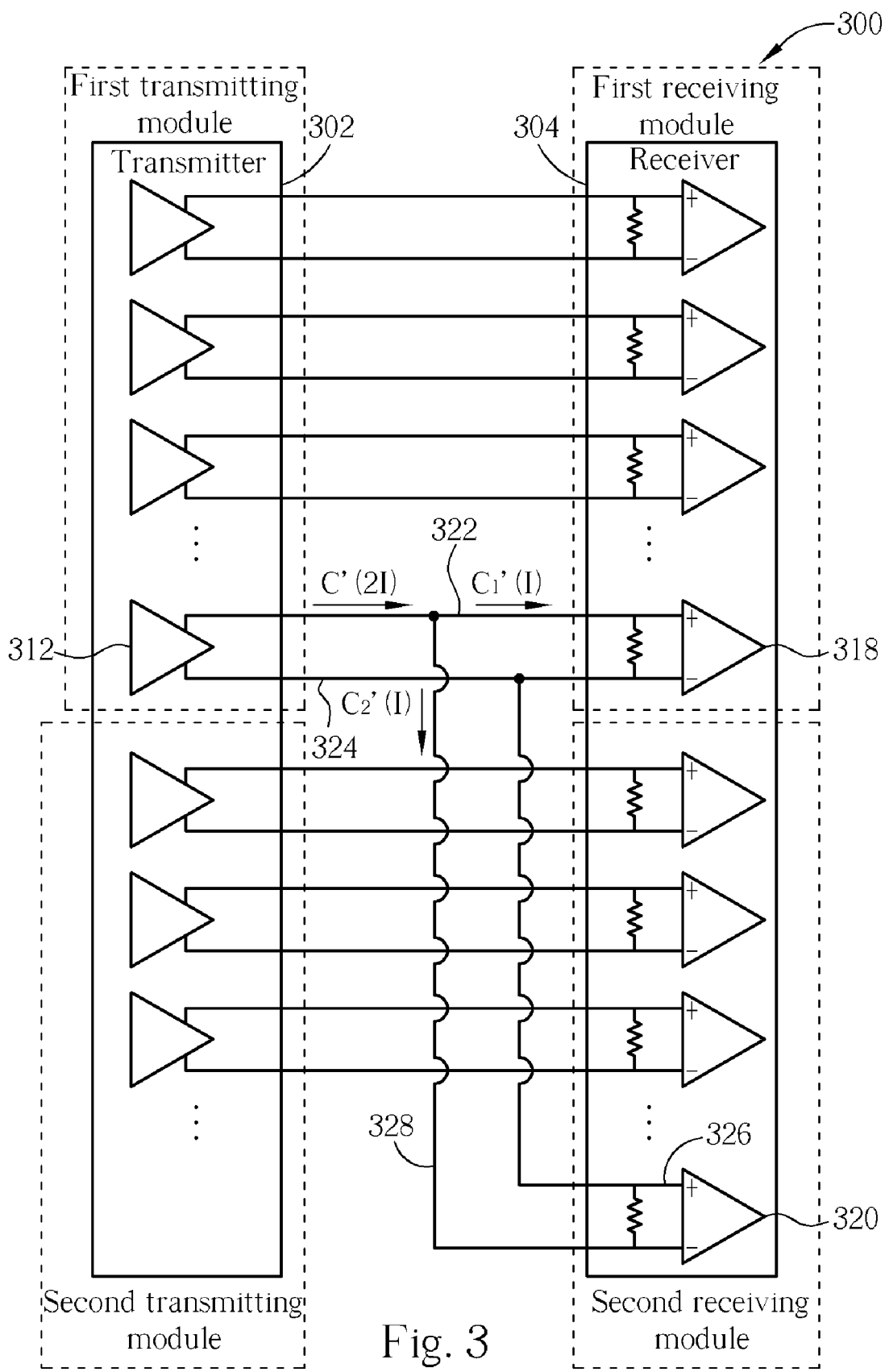
FIG. 3 illustrates a current mode differential signal transmitting circuit according to the second embodiment of the present invention.
Figure 4:
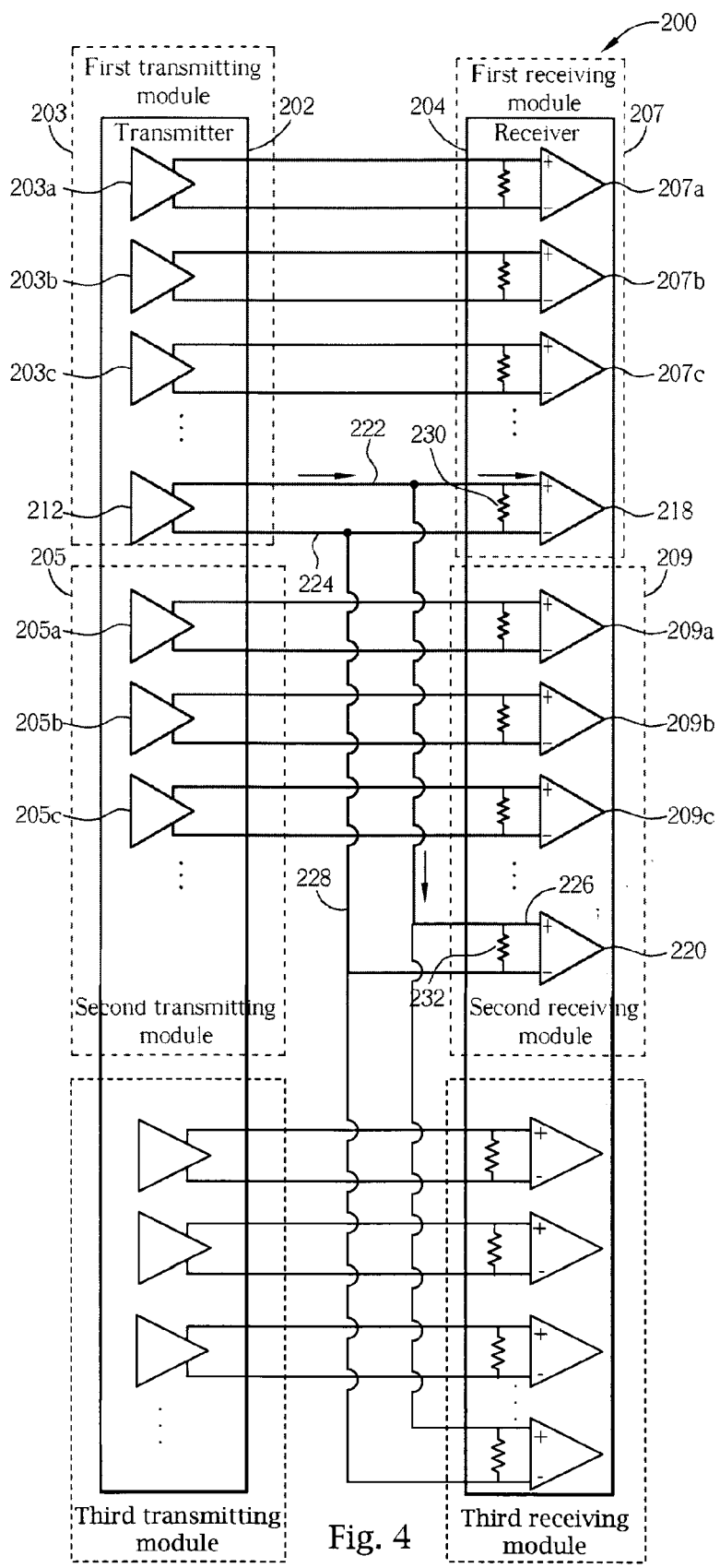
FIG. 4 illustrates a current mode differential signal transmitting circuit according to an alternative embodiment.

Additionally, the connection of the connecting lines can be changed to produce an inversed current to the first clock receiving unit_218, such that the current-mode differential signal transmitting circuit according to the present invention can be applied to all apparatus receiving transmitting signals with phase difference. FIG. 4 illustrates a current mode differential signal transmitting circuit according to an alternative embodiment, whereby a third transmitting module and third receiving module are shown. FIG. 3 illustrates the current-mode differential signal transmitting circuit 300 according to the second embodiment of the present invention. The current-mode differential signal transmitting circuit 300 includes the same devices as that of the current-mode differential signal transmitting circuit 200, thus the operation and the function of all elements are omitted for brevity. A single difference between the current-mode differential signal transmitting circuit 200 and the current-mode differential signal transmitting circuit 300 is the connecting structure of the clock outputting unit 312, the first clock receiving unit 318, the second clock receiving unit 320, the first connecting line 322, the second connecting line 324, the third connecting line 326 and the fourth connecting line_328. In this embodiment, the first connecting line 322 is coupled to a positive terminal of the clock outputting unit 312 and a positive terminal of the first clock receiving unit 318, the second connecting line 324 is coupled to a negative terminal of the clock outputting unit 312 and a negative terminal of the first clock receiving unit 318, the third connecting line 326 is coupled to a negative terminal of the clock outputting unit 312 and a positive terminal of the second clock receiving unit 320, and the fourth connecting line 328 is coupled to a positive terminal of the clock outputting unit 312 and a negative terminal of the second clock receiving unit 320. If the current C' outputted from the clock outputting unit 312 is 2I, then the current $C.sub.1'$ to the first clock receiving unit 318 and the current C2' to the second clock receiving unit 320 are both I. However, the currents to the first clock receiving unit 318 and the second clock receiving unit 320 include inversed direction, thus the two receiving modules can generate clocks with different phases to receive signal.

It should be noted that, in the first embodiment, the first transmitting module 203 and the second transmitting module 205 share the clock outputting unit 212 of the first transmitting module 203, but this does not indicate a limitation of the scope of the present invention. For example, if the first transmitting module 203 includes no clock outputting units and the second transmitting module 205 includes a clock outputting unit 212, the first transmitting module 203 and the second transmitting module 205 can share the clock outputting unit 212 of the second transmitting module 205. Additionally, it is also possible that the clock outputting unit can be shared by a plurality of the transmitting modules, and therefore this configuration also falls in the scope of the present invention. Also, though the clock outputting unit is located in the transmitting module in the above-mentioned embodiments, the clock outputting unit can exist in an independent form from the transmitting module.

Thus, by utilizing the circuit structure described above, pins can be saved by the sharing of the clock outputting unit and the requirement of the current can be met by the connecting lines between the transmitter and the receiver. Therefore, the number of IC pins and the package cost for the IC pins can be reduced, and the number of pads can be reduced thereby decreasing the area of IC. Also, the unused IC pins can be applied for other usage, such that the IC offers more flexibility in design.

The above-mentioned circuit structure can be applied to any kind of current mode differential signal transmitting circuit such as low voltage differential signaling (LVDS) transmitting circuits and reduced swing differential signal (RSDS) transmitting circuits. If a current mode differential signal transmitting circuit is used for processing an image, then the first and second transmitting modules transmit the pixel data of the odd pixels and even pixels, respectively.

It should be noted that the structure of the connecting lines between the transmitter and the receiver is not limited to that described above. Those skilled in the art can easily vary the connecting method and the device locations to obtain the desired current.

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean, "include, but not limited to . . . " Also, the term "couple" is intended to mean either an indirect or direct electrical connection. Accordingly, if one device is coupled to another device, that connection may be through a direct electrical connection, or through an indirect electrical connection via other devices and connections.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A current-mode differential signal transmitting circuit, comprising:
   a transmitter, comprising:
      a first transmitting module, including a plurality of first outputting units to output first data and a clock outputting unit; and
      a second transmitting module, including a plurality of second outputting units for outputting second data; and
   a receiver, comprising:
      a first receiving module, including a plurality of first receiving units coupled to respective outputting units of the plurality of first outputting units, and a first clock receiving unit coupled to the clock outputting unit in the first transmitting module; and
      a second receiving module, including a plurality of second receiving units coupled to respective outputting units of the plurality of second outputting units, and a second clock receiving unit coupled to the same clock outputting unit,
   wherein the first and second transmitting modules share the clock outputting unit of the first transmitting module, and wherein the clock outputting unit outputs two clock signals, both clock signals being sent to respective inputs of each of the first and second clock receiving units.

2. The current-mode differential signal transmitting circuit of claim 1, wherein the clock outputting unit outputs a data transmitting clock signal, and the data transmitting clock signal corresponds to the first data outputted from the first outputting units and the second data outputted from the second outputting units.

3. The current-mode differential signal transmitting circuit of claim 1, wherein the current-mode differential signal transmitting circuit is a low voltage differential signaling (LVDS) transmitting circuit.

4. The current-mode differential signal transmitting circuit of claim 1, wherein the current-mode differential signal transmitting circuit is a reduced swing differential signal (RSDS) transmitting circuit.

5. The current-mode differential signal transmitting circuit of claim 1, wherein the first and second transmitting modules transmit pixel data of odd pixels and even pixels, respectively.

6. The current-mode differential signal transmitting circuit of claim 1, further comprising:
   a first connecting line, coupled to a positive terminal of the clock outputting unit and a positive terminal of the first clock receiving unit;
   a second connecting line, coupled to a negative terminal of the clock outputting unit and a negative terminal of the first clock receiving unit;
   a third connecting line, coupled to a positive terminal of the clock outputting unit and a positive terminal of the second clock receiving unit; and
   a fourth connecting line, coupled to a negative terminal of the clock outputting unit and a negative terminal of the second clock receiving unit.

7. The current-mode differential signal transmitting circuit of claim 6, wherein the currents of the clock signals in the first, the second, the third, and the fourth connecting lines are adjustable.

8. The current-mode differential signal transmitting circuit of claim 1, further comprising:
   a first connecting line, coupled to a positive terminal of the clock outputting unit and a positive terminal of the first clock receiving unit;
   a second connecting line, coupled to a negative terminal of the clock outputting unit and a negative terminal of the first clock receiving unit;
   a third connecting line, coupled to a positive terminal of the clock outputting unit and a negative terminal of the second clock receiving unit; and
   a fourth connecting line, coupled to a negative terminal of the clock outputting unit and a positive terminal of the second clock receiving unit.

9. The current-mode differential signal transmitting circuit of claim 8, wherein the currents of the clock signals in the first, second, third, and fourth connecting lines are adjustable.

10. The current-mode differential signal transmitting circuit of claim 1, wherein the transmitter further comprises a third transmitting module having a plurality of third outputting units for outputting third data.

11. A current-mode differential signal transmitting circuit, comprising:
    a transmitter, comprising:
       a first transmitting module, including a plurality of first outputting units for outputting first data; and
       a second transmitting module, including a plurality of second outputting units for outputting second data; and
    a receiver, comprising:
       a first receiving module, including a plurality of first receiving units coupled to respective outputting units of the plurality of first outputting units, and a first clock receiving unit coupled to a clock outputting unit; and
       a second receiving module, including a plurality of second receiving units coupled to respective outputting units of the plurality of second outputting units, and a second clock receiving unit coupled to the same clock outputting unit,
    wherein the first transmitting module and the second transmitting module share the clock outputting unit, wherein the clock outputting unit is implemented within the first transmitting module, and wherein the clock outputting unit outputs two clock signals, both clock signals being sent to respective inputs of each of the first and second clock receiving units, wherein the first and second clock receiving units receive the two clock signals with a phase difference.

12. The current-mode differential signal transmitting circuit of claim 11, wherein the clock outputting unit outputs a data transmitting clock signal, and the data transmitting clock signal corresponds to the first data outputted from the first outputting units and the second data outputted from the second outputting units.

13. The current-mode differential signal transmitting circuit of claim 11, wherein the transmitter further comprises a third transmitting module including a plurality of third outputting units for outputting third data, and wherein the receiver comprises a third receiving module, including a plurality of third receiving units coupled to respective outputting units of the plurality of third outputting units, and a third clock receiving unit coupled to the same clock outputting unit.

14. The current-mode differential signal transmitting circuit of claim 11, further comprising:
   a first connecting line, coupled to a positive terminal of the clock outputting unit and a positive terminal of the first clock receiving unit;
   a second connecting line, coupled to a negative terminal of the clock outputting unit and a negative terminal of the first clock receiving unit;
   a third connecting line, coupled to a positive terminal of the clock outputting unit and a positive terminal of the second clock receiving unit; and
   a fourth connecting line, coupled to a negative terminal of the clock outputting unit and a negative terminal of the second clock receiving unit; wherein the currents of the clock signals in the first, second, third, and fourth connecting lines are adjustable.

15. The current-mode differential signal transmitting circuit of claim 11, wherein the current-mode differential signal transmitting circuit is a low voltage differential signaling (LVDS) transmitting circuit.

16. The current-mode differential signal transmitting circuit of claim 11, wherein the current-mode differential signal transmitting circuit is a reduced swing differential signal (RSDS) transmitting circuit.

17. The current-mode differential signal transmitting circuit of claim 11, wherein the first and the second transmitting modules transmit pixel data of odd pixels and even pixels, respectively.

18. A current-mode differential signal transmitting circuit, comprising:
   a plurality of transmitting modules, each of the transmitting modules comprising a plurality of outputting units;
   a plurality of receiving modules, each of the receiving modules comprising a plurality of receiving units coupled to respective outputting units for receiving data; and
   a clock outputting unit within a first transmitting module among the plurality of transmitting modules,
   wherein each of the receiving modules further comprises a clock receiving unit each coupled to the clock outputting unit,
   wherein the clock outputting unit outputs a current having a value adjusted according to the number of clock receiving units, and
   wherein the clock outputting unit outputs two clock signals, both clock signals being sent to respective inputs of each of the first and second clock receiving units.

19. The current-mode differential signal transmitting circuit of claim 18, wherein the current value is adjusted by adjusting resistors of each of the clock receiving units.

20. The current-mode differential signal transmitting circuit of claim 19, wherein the current value is greater than a current received at each of the clock receiving units.

21. A current-mode differential signal transmitting circuit, comprising:
   a transmitter configured to transmit a differential signal to a receiver, the differential signal comprising a data signal and a data transmitting clock signal, the transmitter comprising:
   a first transmitting module comprising a plurality of first outputting units for outputting first data of the data signal to a plurality of first receiving units of the receiver and a clock outputting unit for outputting the data transmitting clock signal to a first clock receiving unit and a second clock receiving unit of the receiver; and
   a second transmitting module comprising a plurality of second outputting units for outputting second data of the data signal to a plurality of second receiving units of the receiver,
   wherein the first and second transmitting modules share the clock outputting unit of the first transmitting module, and wherein the data transmitting clock signal corresponds to the first data outputted from the first outputting units and the second data outputted from the second outputting units.

22. The current-mode differential signal transmitting circuit of claim 21, wherein the value of the output current outputted from the clock outputting unit is greater than the value of the receiving current received by the first clock receiving unit.

23. The current-mode differential signal transmitting circuit of claim 21, wherein the value of the output current from the clock outputting unit is approximately twice the value of the receiving current received by the first clock receiving unit.

* * * * *